(12) United States Patent
Brown et al.

(10) Patent No.: US 8,472,146 B2
(45) Date of Patent: Jun. 25, 2013

(54) CURRENT PERPENDICULAR MAGNETORESISTIVE SENSOR WITH A DUMMY SHIELD FOR CAPACITANCE BALANCING

(75) Inventors: Diane L. Brown, San Jose, CA (US); David J. Seagle, Morgan Hill, CA (US)

(73) Assignee: HGST Netherlands B.V., Amsterdam (NL)

( * ) Notice: Subject to any disclaimer, the term of this patent is extended or adjusted under 35 U.S.C. 154(b) by 222 days.

(21) Appl. No.: 12/870,561

(22) Filed: Aug. 27, 2010

(65) Prior Publication Data

US 2012/0050919 A1 Mar. 1, 2012

(51) Int. Cl.
*G11B 5/33* (2006.01)
*G11B 5/127* (2006.01)

(52) U.S. Cl.
USPC .................. 360/319; 360/323; 360/125.3

(58) Field of Classification Search
USPC .............. 360/319, 323, 241, 246.2, 125.3
See application file for complete search history.

(56) References Cited

U.S. PATENT DOCUMENTS

| | | | |
|---|---|---|---|
| 3,908,194 A * | 9/1975 | Romankiw | 360/317 |
| 5,247,413 A * | 9/1993 | Shibata et al. | 360/319 |
| 5,557,492 A * | 9/1996 | Gill et al. | 360/319 |
| 5,761,009 A | 6/1998 | Hughbanks et al. | |
| 6,081,409 A * | 6/2000 | Hughbanks et al. | 360/128 |
| 7,239,488 B2 * | 7/2007 | Zhu et al. | 360/323 |
| 7,256,970 B2 * | 8/2007 | Shen et al. | 360/322 |
| 7,274,539 B2 | 9/2007 | Kiyono et al. | |
| 7,379,277 B2 | 5/2008 | Burbank et al. | |
| 7,392,579 B2 | 7/2008 | Leung et al. | |
| 7,400,474 B2 * | 7/2008 | Biskeborn et al. | 360/323 |
| 7,436,633 B2 | 10/2008 | Kiyono et al. | |
| 7,542,245 B2 | 6/2009 | Kagami et al. | |
| 7,545,608 B2 | 6/2009 | Araki et al. | |
| 7,911,743 B2 * | 3/2011 | Hachisuka et al. | 360/316 |
| 8,107,200 B2 * | 1/2012 | Leung et al. | 360/323 |
| 2004/0017640 A1 * | 1/2004 | Hughbanks et al. | 360/323 |
| 2008/0055774 A1 | 3/2008 | Kubota | |
| 2008/0055788 A1 | 3/2008 | Nagai | |
| 2008/0074798 A1 | 3/2008 | Fujieda | |
| 2008/0239584 A1 | 10/2008 | Anagawa et al. | |
| 2009/0154028 A1 | 6/2009 | Jang | |
| 2009/0168259 A1 | 7/2009 | Marley et al. | |
| 2009/0168261 A1 | 7/2009 | Furuya et al. | |
| 2009/0213501 A1 | 8/2009 | Kagami et al. | |
| 2009/0310263 A1 | 12/2009 | Sasaki | |

FOREIGN PATENT DOCUMENTS

WO   WO 2008/142748 A1   11/2008

* cited by examiner

*Primary Examiner* — Brian Miller
(74) *Attorney, Agent, or Firm* — Zilka-Kotab, PC

(57) ABSTRACT

A perpendicular magnetic read head having a balanced capacitive coupling with the substrate. The read head includes a magnetoresistive sensor with first and second magnetic, electrically conductive shields separated from a substrate by a layer of non-magnetic, electrically insulating material. A dummy magnetic shield is formed on the non-magnetic electrically insulating layer and is electrically connected with the second magnetic, electrically conductive shield. The dummy shield is formed to have a capacitive coupling with the substrate that matches the capacitive coupling of the first magnetic, electrically conductive shield with the substrate.

18 Claims, 10 Drawing Sheets

CURRENT PERPENDICULAR MAGNETORESISTIVE SENSOR WITH A DUMMY SHIELD FOR CAPACITANCE BALANCING

FIELD OF THE INVENTION

The present invention relates to magnetic heads for data recording, and more particularly to a magnetic head that includes a current perpendicular to plane magnetoresistive sensor that has capacitance balancing for improved performance.

BACKGROUND OF THE INVENTION

The heart of a computer's long term memory is an assembly that is referred to as a magnetic hard disk drive. The magnetic hard disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

In addition to magnetic disk drives, magnetic tape drives are employed to store magnetic data, such as for long term storage. Such tape drive devices include a slider that includes a magnetoresistive sensor and a magnetic write head. A magnetic tape slides over the surface allowing data to be written to or read from the tape.

The write head can include a coil that passes through a magnetic yoke that includes a write pole and a return pole. Current conducted to the coil layer induces a magnetic flux in the pole pieces which causes a write field to emit from the write pole for the purpose of writing a magnetic transition in tracks on the moving media, such as in circular tracks on the rotating disk.

Traditionally a sensor such as a GMR or TMR sensor has been employed for sensing magnetic fields from the rotating magnetic disk. Such sensors use a spin valve magnetic design, including a nonmagnetic conductive spacer layer, or nonmagnetic insulating barrier layer, sandwiched between first and second ferromagnetic layers, referred to as a pinned or reference layer and a free layer. First and second leads are connected to the sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, conduction or tunneling of electrons through the stack of layers is maximized and when the magnetizations of the pinned and free layer are antiparallel, overall conductivity is reduced. Changes in conduction or tunneling alter the resistance of the spin valve sensor substantially in proportion to $\cos \theta$, where $\theta$ is the angle between the magnetizations of the pinned and free layers. When reading stored information the resistance of the sensor changes approximately proportionally to the magnitude of the magnetic fields from the rotating disk. When a sense current flows through the spin valve sensor, resistance changes cause potential changes that are detected and processed as playback signals.

SUMMARY OF THE INVENTION

The present invention provides a magnetic head that includes a substrate, and a magnetoresistive sensor sandwiched between first and second electrically conductive magnetic leads. A non-magnetic, electrically insulating layer separates the first magnetic shield from the substrate, and a dummy shield is formed on the non-magnetic, electrically insulating layer, the dummy shield being electrically connected with the second, electrically conductive magnetic shield.

The dummy magnetic shield advantageously balances the capacitive coupling between the first magnetic shield and the substrate. The dummy magnetic shield is formed so that it has the same capacitive coupling with the substrate as the first magnetic shield does. Because the dummy shield is electrically connected with the second magnetic shield the capacitive load across the read head is completely balanced.

The dummy magnetic shield can be formed in the same process steps used to form the first magnetic shield. The balanced capacitive coupling, therefore, adds no additional manufacturing cost or complexity.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
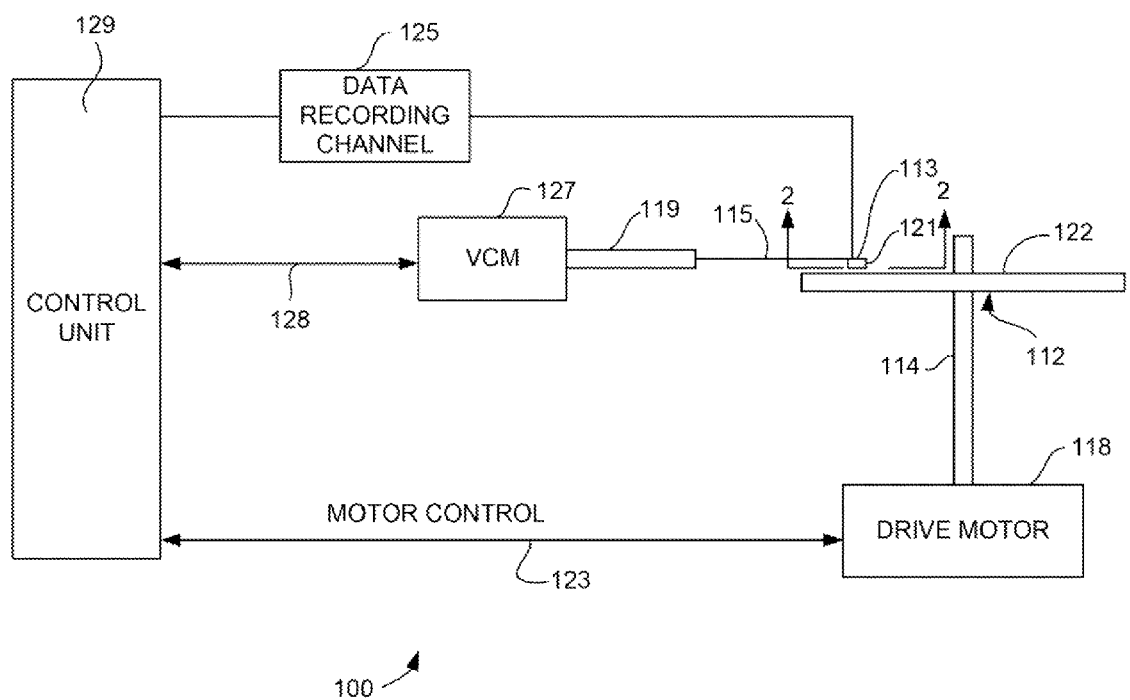
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts a force on the slider. The air bearing thus counter-balances the slight spring force of suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
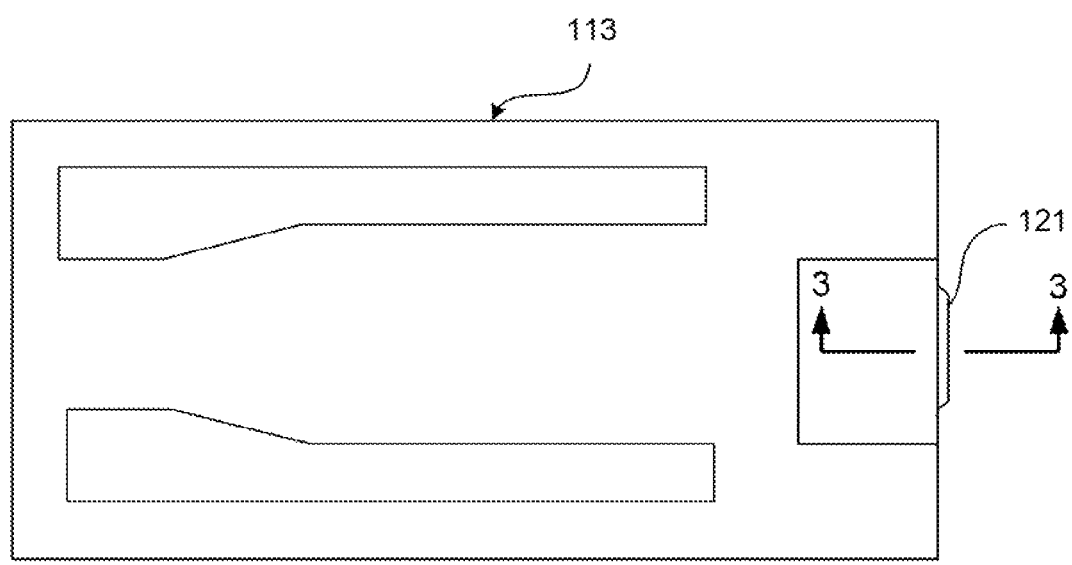
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1, are for representation purposes only. It should be apparent that disk storage systems may contain a large number of disks and actuators, and each actuator may support a number of sliders.

Figure 3:
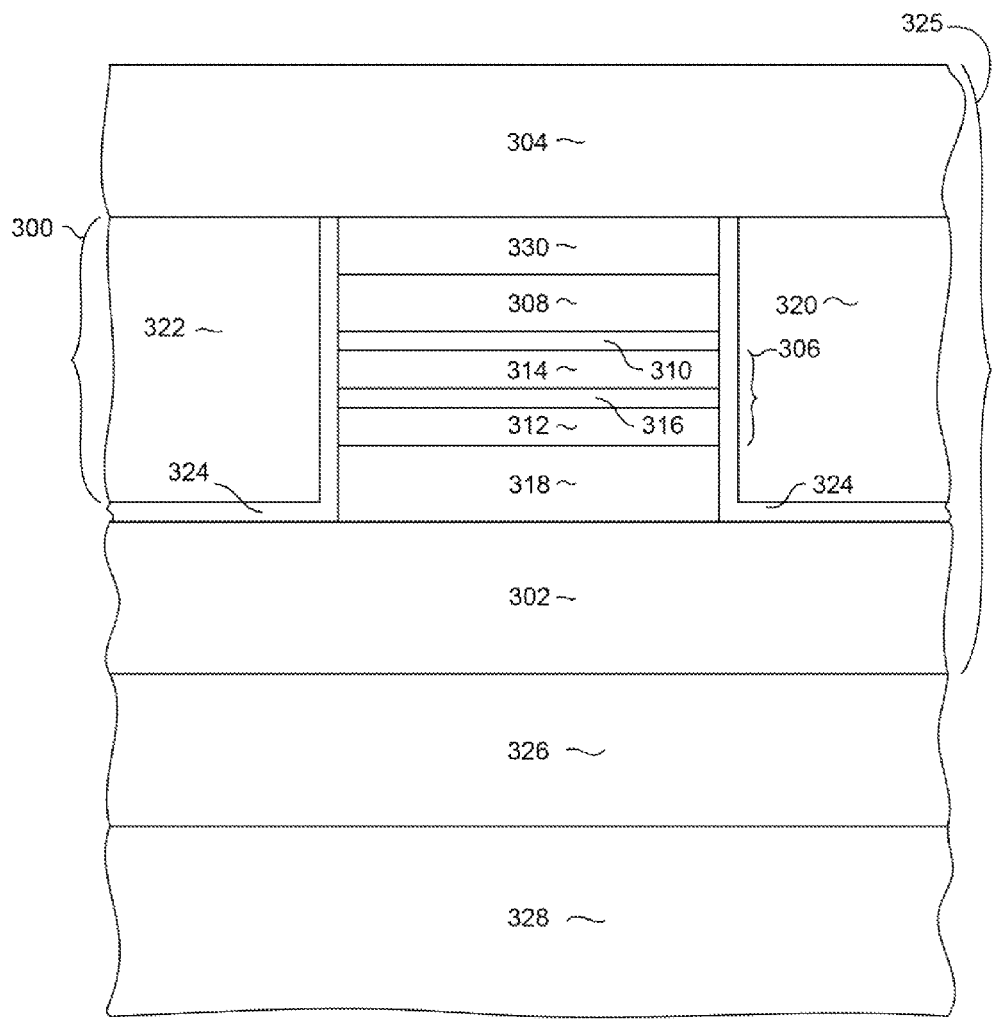
FIG. 3 is a schematic ABS view of a sensor according to an embodiment of the invention.

FIG. 3 shows an example of a current perpendicular to plane magnetoresistive sensor 300, such as might be used in a magnetic disk drive or a magnetic tape drive. The sensor 300 is sandwiched between first and second electrically conductive, magnetic shields 302, 304 that also function as electrical leads for conducting a sense current through the sensor in a direction perpendicular to the planes of the layers of the sensor 300.

The sensor 300 includes a magnetic pinned layer structure 306, a magnetic free layer structure 308 and a non-magnetic layer 310 sandwiched between the pinned layer structure 306 and the free layer structure 308. If the sensor 300 is a current perpendicular to plane (CPP) giant magnetoresitive (CPP-GMR) sensor, the non-magnetic layer 310 is an electrically conductive spacer layer such as Cu. If the sensor 300 is a tunnel junction magnetoresistive (TMR) sensor, then the non-magnetic layer 310 is a thin electrically insulating barrier layer.

The pinned layer structure can be an antiparallel coupled (AP coupled) structure including a first magnetic layer (AP1) 312, a second magnetic layer (AP2) 314 and a non-magnetic antiparallel coupling layer 316 such as Ru sandwiched between the AP1 and AP2 layers 312, 314. The AP1 layer 312 can be exchange coupled with a layer of antiferromagnetic material (AFM layer) 318, which strongly pins the magnetization of the AP1 layer 312 in a desired direction perpendicular to the ABS. Antiparallel coupling between the AP1 and AP2 layers pins the magnetization of the AP2 layer in a second direction that is antiparallel with the AP1 layer 312 and perpendicular with the ABS.

The free layer has a magnetization that is biased in a direction parallel with the ABS by magnetostatic coupling with first and second hard magnetic bias layers 320, 322. The hard bias layers 320, 322 are separated from the sensor layers 300 and from at least one of the shield/lead layers 302 by an electrically insulating layer 324 such as alumina. A capping layer 330 can be provided at the top of the sensor stack 300 to protect the free layer 308 during manufacture.

The sensor 300, shields 302, 304, bias layers 320, 322 and insulation layers 324 form a magnetic head 325 that is formed on a non-magnetic, electrically insulating layer 326. The electrically insulating layer 326 separates the head 325 from a substrate material 328. The substrate 328 is formed of a hard, electrically conductive material such a composite material of alumina ($Al_2O_3$) and titanium carbide (TC), which is generally abbreviated as AlTiC. The electrically insulating layer 326 can be constructed of a material such as alumina $Al_2O_3$.

Figure 4:
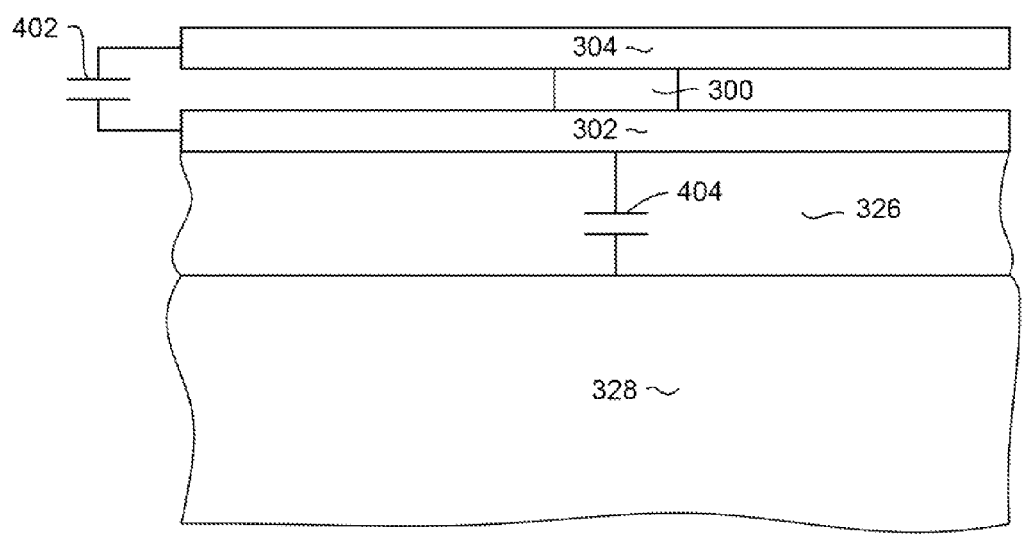
FIG. 4 is an enlarged schematic ABS view of a prior art magnetic head exhibiting unbalanced capacitive coupling between the sensor and the substrate.

FIG. 4 is an enlarged, schematic view of a sensor 300 in relation to the substrate, and illustrates an unbalanced capacitive coupling that exists between the sensor and substrate in a prior art magnetic head structure. As can be seen in FIG. 4, when in operation a voltage potential exists between the shields 302, 304 and an electrical resistance of the sensor 300 results in a capacitive coupling 402 between the shields.

In addition, because the electrically conductive shield 302 is separated from the electrically conductive substrate 328 by the dielectric layer 326, a capacitive coupling 404 exists between the bottom shield 302 and the substrate 328. As can be seen then, the bottom shield 304 experiences a different capacitance than the top shield. This unbalanced capacitive coupling results in diminished sensor performance. For example, the unbalanced capacitive coupling can lead to unwanted stray pickup of signal from the substrate. It is, therefore, desirable to eliminate this unwanted unbalanced capacitance. It is also preferable that this be achieved with as little additional manufacturing cost or complexity as possible.

Figure 5:
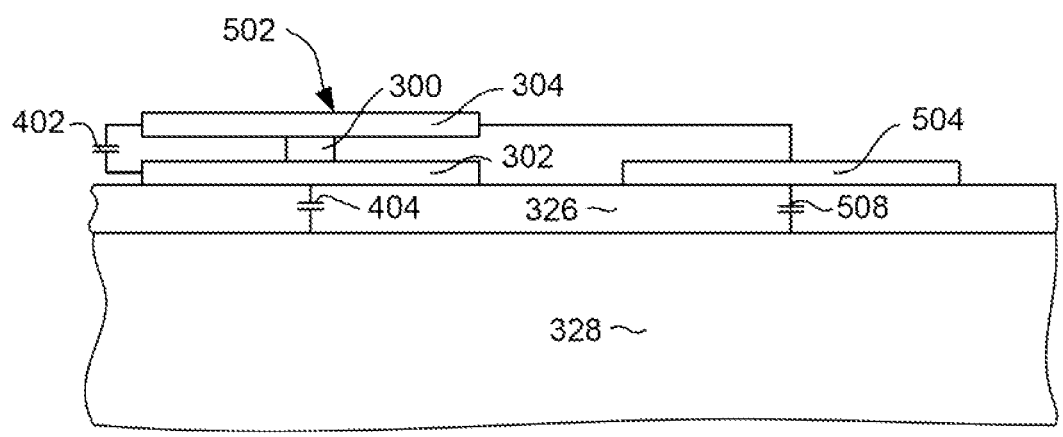
FIG. 5 is an enlarged schematic ABS view of a magnetic head according to an embodiment of the invention, illustrating a structure for balanced capacitance.

With reference now to FIG. 5, a read head structure 502 is shown that can eliminate any unbalanced capacitance. Furthermore, as will be seen, this is achieved with virtually no additional cost. The read head structure 502 includes a magnetic sensor 300 and shield/leads 302, 304 as described above with reference to FIG. 3. As before, the sensor 300 and leads 302, 304 are separated from the substrate 328 by an insulation layer 326.

In addition, the read head structure 502 includes a dummy shield structure 504, that is laterally away from the first lower shield 302. The dummy shield 504 is electrically connected with the upper shield 304 by an electrical lead 506 that can be constructed of a non-magnetic, electrically conductive material such as Au, Cu, etc. The dummy shield is designed to have a capacitive coupling 508 between itself and the substrate 328 that is the same as the capacitive coupling 404 between the lower shield 302 and the substrate 328. To this end, the dummy shield is preferably constructed of a material having the same composition and size as the lower shield 302, and is formed on the insulation layer 326 so as to be separated from the substrate 328 by the same distance that the shield 302 is separated from the substrate 328.

Because the dummy shield 504 has the same capacitive coupling 508 with the substrate 328 as the lower shield, and because the dummy shield 504 is electrically connected with the upper shield 304, this causes the upper shield 304 to have a capacitive coupling with the substrate that is completely balanced with the capacitive coupling 404 of the lower shield with the substrate. This advantageously eliminates any problems that would otherwise be associated with an unbalanced capacitive coupling.

The above benefits can be achieved with very little additional manufacturing cost or complexity. This is because the dummy shield can be constructed in the very same processing steps that are used to construct the lower shield 302. For example, the lower shield can be constructed by an electroplating process described with reference to FIGS. 6 through 10.

Figure 6:
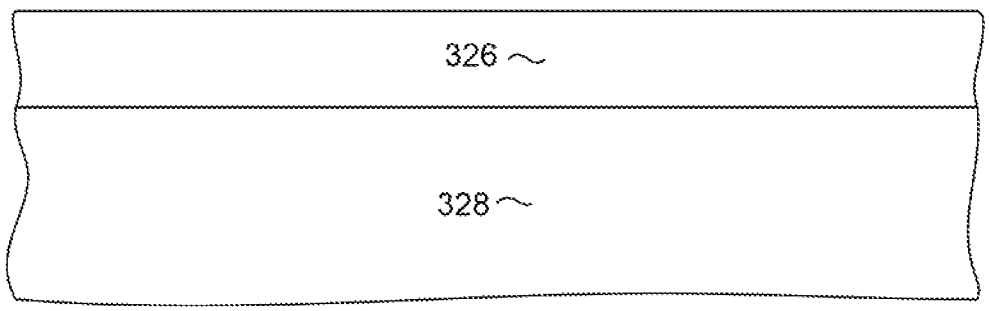
FIGS. 6-10 are cross sectional views showing a magnetic read head in various intermediate stages of manufacture, illustrating a method of manufacturing a read head with a dummy shield for capacitive balance.

With reference to FIG. 6, the substrate is provided, which may be in the form of an AlTiC wafer or some similar material. An insulating layer 326 is deposited over the substrate 328. This may be accomplished, for example, by sputter depositing a layer of alumina and then planarizing the layer by chemical mechanical polishing to form it with a smooth upper surface.

Figure 7:
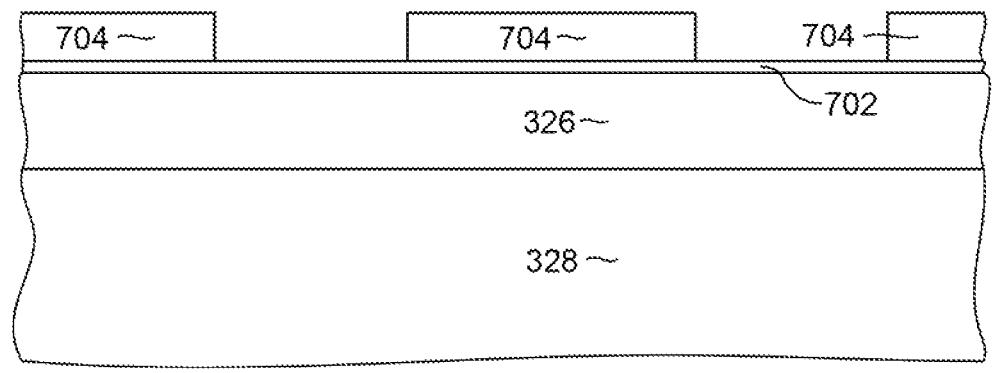

With reference to FIG. 7, an electrically conductive electroplating seed layer 702 is deposited, such as by sputter deposition. This seed layer 702 may be a magnetic material such a NiFe or CoFe. Then, an electroplating frame mask 704 is formed, such as by spinning on a photoresist layer and then photolithographically patterning and developing the photoresist. The photoresist is formed with openings that are configured to define a bottom shield and a dummy shield as will be seen.

Figure 8:
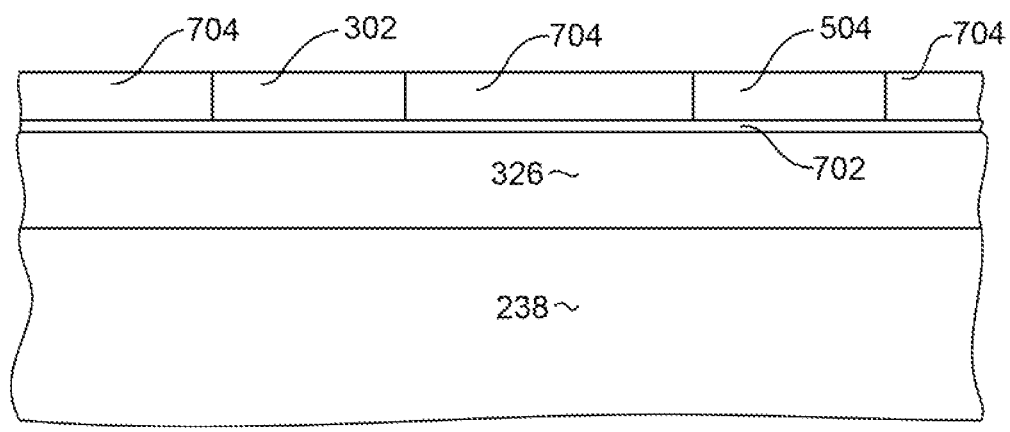
Figure 9:
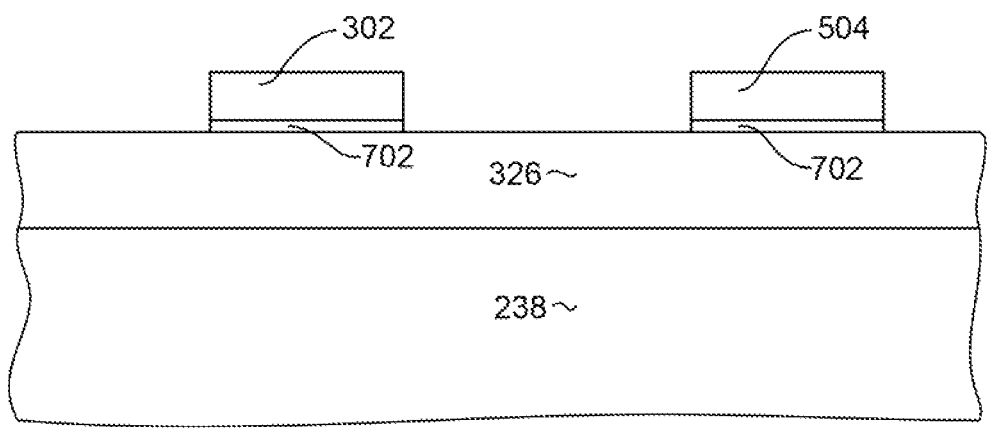
Figure 10:
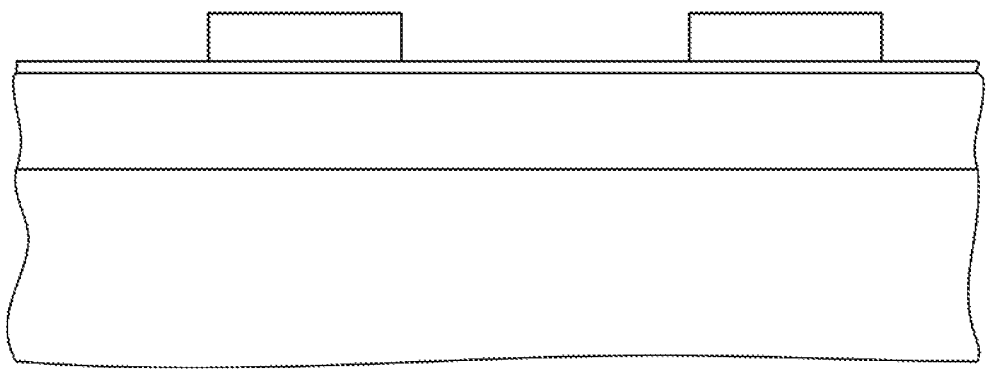

Then, with reference to FIG. 8 a magnetic material is electroplated into the openings in the mask 704 to form a magnetic lower shield 302 and a dummy shield 504. A chemical mechanical polishing may optionally be performed to planarize the surface of the shields shield 302 and dummy shield 504. Then, the photoresist mask can be lifted off, such as by a chemical liftoff process, leaving a structure as shown in FIG. 9. A quick ion milling can then be performed to remove portions of the seed layer 702 that are not protected by the shields 302, 504, leaving a structure as in FIG. 10.

Thereafter, additional processing steps can be performed to construct the sensor as would otherwise be performed. The lead 506 (FIG. 5) can be formed in the same processing steps that are used to form electrical connections with the leads 302, 304 in the ordinary course of manufacturing a magnetic head. It can be seen then the construction of the dummy shield 504, as well as the lead 506 no additional manufacturing complexity or cost since they are formed in the same processing steps used to construct the magnetic head generally.

While various embodiments have been described above, it should be understood that they have been presented by way of example only, and not limitation. Other embodiments falling within, the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic head, comprising:
   a substrate;
   a magnetoresistive sensor sandwiched between first and second electrically conductive magnetic shields;
   a non-magnetic, electrically insulating layer separating the first electrically conductive magnetic shield from the substrate; and
   a dummy shield formed on the non-magnetic, electrically insulating layer, the dummy shield being electrically connected with the second, electrically conductive magnetic shield.

2. A magnetic head as in claim 1 wherein the first electrically conductive shield is located closer to the substrate than the second electrically conductive magnetic shield.

3. The magnetic head as in claim 1 wherein the first electrically conductive magnetic shield has a first capacitive coupling with the substrate, and wherein the dummy magnetic shield has a second capacitive coupling with the substrate that is the same as the first capacitive coupling.

4. The magnetic head as in claim 1 wherein the dummy shield and the first electrically conductive magnetic shield are constructed of the same material.

5. The magnetic head as in claim 1 wherein the first electrically conductive shield and the dummy shield have the same shape as one another.

6. The magnetic head as in claim 1 wherein the first electrically conductive magnetic shield and the dummy shield each have the same shape as one another and are constructed of the same material as one another.

7. The magnetic head as in claim 1 wherein the dummy shield is laterally removed from the first electrically conductive magnetic shield and wherein the first electrically conductive magnetic shield and the dummy shield each have upper and lower surfaces that are co-planar with one another.

8. The magnetic head as in claim 1 wherein the magnetoresistive sensor is a current perpendicular to plane sensor.

9. The magnetic head as in claim 1 wherein the magnetic head is designed for use in a magnetic disk drive system.

10. The magnetic head as in claim 1 wherein the magnetic head is designed for use in a magnetic tape drive system.

11. The magnetic head as in claim 1 wherein the first and second electrically conductive magnetic shields and the dummy shield are all constructed of NiFe.

12. The magnetic head as in claim 1 wherein the first and second electrically conductive magnetic shields and the dummy shield are all constructed of CoFe.

13. The magnetic head as in claim 1 wherein the substrate comprises AlTiC.

14. The magnetic head as in claim 1 wherein the substrate comprises AlTiC, and the non-magnetic, electrically insulating layer comprises alumina.

15. A magnetic disk drive, comprising:
   a housing:
   a magnetic media rotatably mounted within the housing;
   a suspension arm assembly, pivotally mounted within the housing;
   a slider connected with the suspension arm assembly, the slider providing a substrate;
   a magnetoresistive sensor sandwiched between first and second electrically conductive magnetic shields;
   a non-magnetic, electrically insulating layer separating the first magnetic shield from the substrate; and
   a dummy shield formed on the non-magnetic, electrically insulating layer, the dummy shield being electrically connected with the second, electrically conductive magnetic shield.

16. The magnetic disk drive as in claim 15 wherein the dummy shield and the first electrically conductive magnetic shield have coplanar upper and lower surface and wherein the first electrically conductive magnetic shield has a first capacitive coupling with the substrate and the dummy shield has a second capacitive coupling with the substrate that is the same as the first capacitive coupling.

17. A magnetic tape drive, comprising:
   a housing;
   a slider mounted within the housing, the slider providing a substrate;
   a mechanism for moving a magnetic tape past the slider;
   a magnetoresistive sensor sandwiched between first and second electrically conductive magnetic shields;
   a non-magnetic, electrically insulating layer separating the first magnetic shield from the substrate; and
   a dummy shield formed on the non-magnetic, electrically insulating layer, the dummy shield being electrically connected with the second, electrically conductive magnetic shield.

18. The magnetic tape drive as in claim 17 wherein the dummy shield and the first electrically conductive magnetic shield have coplanar upper and lower surface and wherein the first electrically conductive magnetic shield has a first capacitive coupling with the substrate and the dummy shield has a second capacitive coupling with the substrate that is the same as the first capacitive coupling.

* * * * *